United States Patent [19]

Garskamp

[11] Patent Number: 4,972,512
[45] Date of Patent: Nov. 20, 1990

[54] CIRCUIT FOR LINEARLY AMPLIFYING AND DEMODULATING AN AM-MODULATED SIGNAL, AND INTEGRATED SEMICONDUCTOR ELEMENT FOR SUCH CIRCUIT

[75] Inventor: Arnoldus Garskamp, Eindhoven, Netherlands

[73] Assignee: U.S. Philips Corp., New York, N.Y.

[21] Appl. No.: 313,669

[22] Filed: Feb. 21, 1989

[30] Foreign Application Priority Data

Feb. 29, 1988 [NL] Netherlands ............... 8800510

[51] Int. Cl.[5] ..................... H04B 1/16; H03F 3/04
[52] U.S. Cl. ..................... 455/341; 307/492; 307/490; 330/302; 330/310; 328/145
[58] Field of Search ............... 455/341, 296, 303, 311, 455/312; 330/250, 295, 302, 305, 307, 310; 328/145; 307/492, 494, 490

[56] References Cited

U.S. PATENT DOCUMENTS

| 3,605,027 | 9/1971 | Nichols et al. | 307/492 |
| 3,757,136 | 9/1973 | Hughes | 307/492 |
| 4,090,150 | 1/1977 | Vachenauer | 330/302 |
| 4,385,364 | 5/1983 | Main | 307/492 |
| 4,716,316 | 12/1987 | Colin | 307/492 |

FOREIGN PATENT DOCUMENTS

| 0018843 | 1/1987 | Japan | 455/341 |
| 0020429 | 1/1987 | Japan | 455/341 |

OTHER PUBLICATIONS

William L. Barber et al., "A True Logarithmic Amplifier for Radar IF Applications", IEEE, Journal of Solid-State Circuits, vol. SC-15, No. 3, pp. 291-295.

Primary Examiner—Benedict V. Safourek
Assistant Examiner—Ralph Smith
Attorney, Agent, or Firm—Emmanuel J. Lobato

[57] ABSTRACT

Circuit arrangement for linearly amplifying and demodulating an AM-modulated signal, and integrated semiconductor element for said circuit arrangement. A linear amplifier and demodulator for AM-modulated signals comprises a logarithmic amplifier having a number of amplifier stages successively operating in a limiting mode, an antilog circuit, and DC separation between the logarithmic amplifier and the antilog circuit.

11 Claims, 2 Drawing Sheets

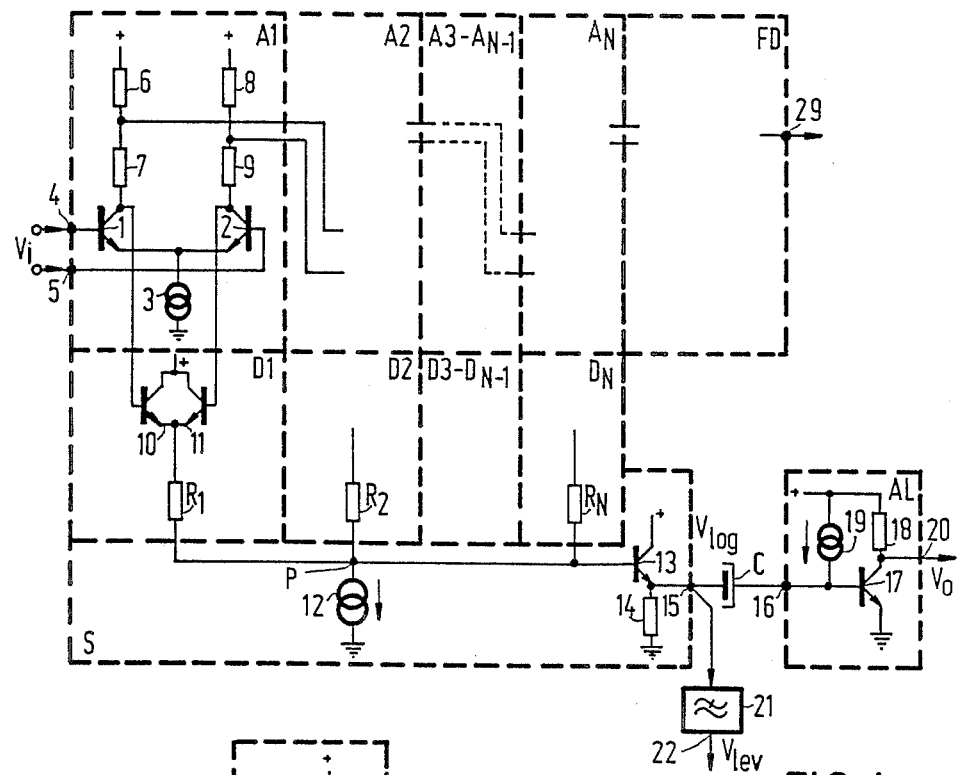
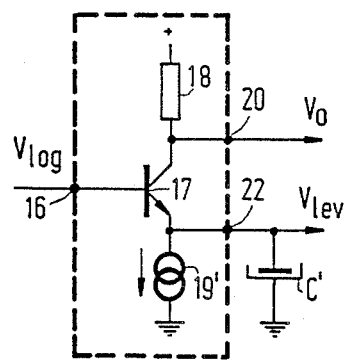
FIG.4
FIG.5
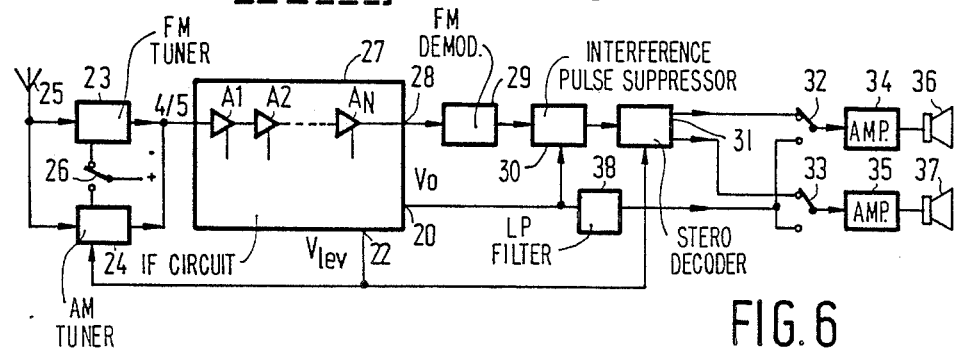
FIG.6

CIRCUIT FOR LINEARLY AMPLIFYING AND DEMODULATING AN AM-MODULATED SIGNAL, AND INTEGRATED SEMICONDUCTOR ELEMENT FOR SUCH CIRCUIT

BACKGROUND OF THE INVENTION

The invention relates to a circuit for linearly amplifying and for demodulating an AM-modulated signal. Such circuits are known and are frequently used, for example, in broadcasting receivers for amplifying and demodulating an intermediate-frequency AM-modulated audio or video signal.

It is important that the gain remains linear over a large dynamic range, that is to say, the amplifier should be prevented from performing its limiting action in the case of a large signal field strength. For this purpose it is conventional practice to use automatic gain control. In the case of larger signal field strengths the gain of a stage is reduced so that the subsequent stages are prevented from performing their limiting actions.

However, automatic gain control has its drawbacks. A plurality of circuit elements is required for deriving, postponing, amplifying and/or smoothing the required control voltage. Amplifier stages must be controllable for which concessions must be made to the noise and/or distortion properties of the amplifier stages. Moreover, an effect of the AVC is that the lowest frequencies of the modulation signals are partly suppressed, resulting in an undesirable attenuation of the demodulated signal at the low end of the frequency characteristic.

SUMMARY OF THE INVENTION

It is an object of the invention to provide a circuit for linearly amplifying and demodulating an AM-modulated signal in which at least a part of the above-mentioned drawbacks of automatic gain control is obviated and to this end the circuit arrangement according to the invention is characterized by
  a logarithmic amplifier of the type having a plurality of limiting amplifier stages which successively perform their limiting actions in response to an increase of the input signal, and having a demodulation circuit for each stage and an adder circuit which is common for all stages, the logarithmic amplifier having an input for receiving the AM-modulated signal and an output for supplying a demodulated, logarithmically distorted output signal;
  an antilog circuit having an input connected to the output of the logarithmic amplifier for substantially compensating the logarithmic distortion of the output signal of the logarithmic amplifier and for supplying the demodulated AM signal;
  and a DC separation arranged to prevent the DC component of the output signal of the logarithmic amplifier from being applied to the input of the antilog circuit.

It is also an object of the invention to provide a semiconductor element for use in such a circuit.

The invention is based on the recognition that considerable advantages are obtained in applications in which a linear signal gain is required, if the AM-modulated signal is first amplified and demodulated by such a logarithmic amplifier, the resultant field strength-dependent DC component is blocked and the logarithmically distorted signal is subsequently linearized again by means of an antilog circuit.

Logarithmic amplifiers of the type described above are known per se from IEEE, Journal of Solid State Circuits, Vol. SC-15, no. 3, June 1980, pp. 291-295 or from German Auslegeschrift 2,606,270 and corresponding U.S. Pat. No. 4,090,150. These logarithmic amplifiers are used for amplifying and demodulating AM-modulated signals having a large dynamic range in which compression of large signal amplitudes is desired as, for example, in IF radar applications or in radiation detectors. Due to the logarithmic compression, AVC can then be avoided.

It is also known (GB-A- No. 1,600,117) to combine a logarithmic amplifier with an antilog circuit for non-linearly amplifying, for example, squaring of signals.

For a satisfactory logarithmic characteristic the gain of each of the amplifier stages should be comparatively small (for example. <15 db). On the other hand the amplitude of the signal applied to the antilog circuit should have the correct value for an optimum compensation of the logarithmic distortion. To satisfy the two requirements, the circuit arrangement according to the invention may be characterized in that the logarithmic amplifier comprises amplifier stages having a first output for supplying signals with a given gain to a subsequent stage, and a second output for supplying signals with a higher gain to the relevant demodulation circuit.

The antilog circuit is realised in a simple manner by means for applying the demodulated, logarithmically distorted output signal of the logarithmic amplifier to the series arrangement of a capacitor and a pn junction of a semiconductor element, a current source connected to the common connection between the capacitor and the pn junction for supplying a bias current in the forward direction to the pn junction and means for deriving the demodulated AM signal from the current through the pn junction. A further economy of elements can be realized if the pn junction comprised of the base-emitter junction of a transistor, if the capacitor and the current source are connected to the emitter electrode of the transistor and if the output for the demodulated AM signal is coupled to the collector electrode of the transistor.

It is to be noted that it is known per se to use in FM receivers a logarithmic amplifier of the type with a cascade of amplifier stages successively performing their limiting actions in response to an increase of the input signal and with stepwise demodulation for supplying an FM field strength-dependent control quantity which is then used, for example, for the FM field strength-dependent mono-stereo control of a stereo decoder circuit. The FM signal which is non-linearly amplified by the cascade of amplifier stages is then applied to an FM detector for demodulating the FM signal.

The use of the circuit arrangement according to the invention in an AM-FM receiver has the advantage that the limiting amplifier stages can be used both for amplifying the FM signals and for amplifying the AM signals and that the entire logarithmic amplifier may serve for both receptions, namely for the non-linear amplification and detection of the AM signals and possibly for generating a field strength-dependent control quantity in the case of AM reception on the one hand and for generating the field strength-dependent control quantity in the case of FM reception on the other hand.

In FM receivers for use in motor vehicles it is known to use a suppression circuit (IAC) for suppressing interference pulses in the demodulated FM signal. When using such a suppression circuit the circuit arrangement according to the invention may further be characterized by a connection for supplying suppression pulses from the output for supplying the demodulated AM signal to the suppression circuit.

All this means that a considerable simplification can be obtained with the invention as compared with circuits in which substantially entirely separated sections for FM reception and for AM reception are used. This also means that it is possible to provide an integrated semiconductor element in a simple and inexpensive manner, which element can find universal use in an AM receiver, in an FM receiver, in an AM-FM receiver and in a receiver for signals which are both AM and FM-modulated. Such a semiconductor element will then preferably comprise the integratable circuit elements of the logarithmic amplifier, the antilog circuit and the FM detector, as well as a common input for all signals to be amplified and demodulated, an output for the demodulated FM signal, an output for the demodulated AM signal and an output for the field strength-dependent control quantity.

BRIEF DESCRIPTION OF THE DRAWING

The invention will now be described in greater detail, by way of example, with reference to the accompanying drawings in which

FIG. 4 is a detailed circuit diagram of a circuit according to the invention;

FIG. 5 is a modification of the circuit diagram of FIG. 4 and

FIG. 6 is a block diagram of a circuit according to the invention for receiving and processing AM or FM-modulated radio signals.

DETAILED DESCRIPTION OF THE INVENTION

Figure 1:
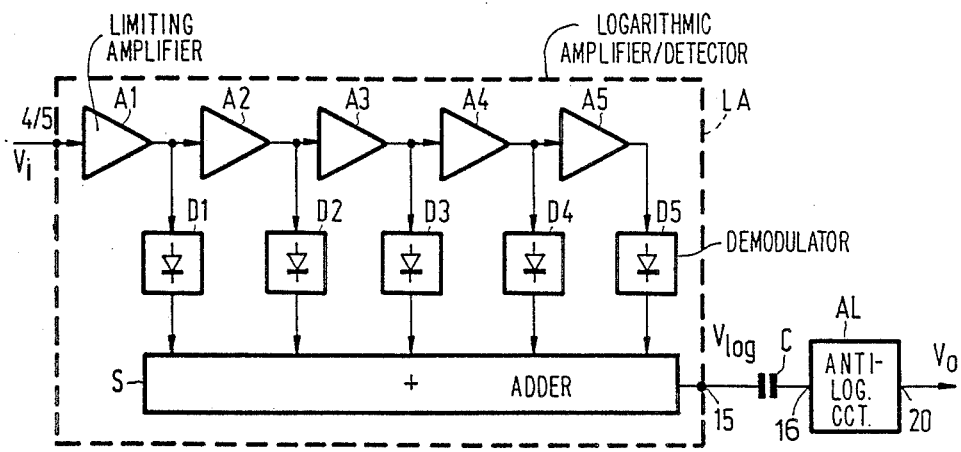
FIG. 1 is a block diagram of a circuit according to the invention.

The circuit diagram of FIG. 1 shows a cascade of five limiting amplifier stages A1 to A5, with the input of the amplifier stage A1 being coupled to an input terminal 4/5 and each input of the subsequent stages A2 to A5 being coupled to the output of the previous stage A1 to A4. Each output of the amplifier stages A1 to A5 is also coupled to an input of a demodulation circuit D1 to D5 and the outputs of the demodulation circuits are coupled to inputs of an adder circuit S in which the output signals of the amplifier stages demodulated by the demodulation circuits are summed. The output signal $V_{log}$ of the adder circuit S is applied via a terminal 15 and a DC separation symbolically shown by means of a capacitor C to an antilog circuit AL having an input terminal 16 and an output terminal 20 for supplying the linear, demodulated signal $V_o$. An amplitude-modulated input signal $V_i$ is applied to the input terminal 4/5, for example, an AM-modulated intermediate-frequency signal of 470 KHz in a radio receiver for AM-modulated signals. The amplitude of the input signal $V_i$ may vary due to two causes, namely due to the signal modulation (approximately 20 db) on the one hand but considerably more on the other hand (for example, 50-60 db) due to field strength variations with which the signal received via an antenna and RF preliminary stage (not shown) is beset. The highest field strength variations may be reduced by an AGC control on the RF preliminary stage, but the input signal $V_i$ is still substantially uncontrolled.

The amplitude variations of the input signal $V_i$ ensure that alternately more or fewer stages of the amplifier stages A1 to A5 perform their limiting actions. In the case of small input signals all stages are non-limiting, but in response to an increase of the input signal first the amplifier stage A5, and subsequently the amplifier stage A1 and so forth will perform their limiting actions. The output signals of the amplifier stages are stepwise demodulated in the demodulation circuits D1 ... D5 and subsequently summed in the adder circuit S.

The known combination of limiting amplifier stages, demodulation circuits and adder circuits constitutes a logarithmic amplifier/detector LA whose output signal $V_{log}$ is a more or less satisfactory approximation of the logarithm of the amplitude of the input signal. The logarithmic relation between $V_{log}$ and the amplitude of $V_i$ is better approximated as the gain per stage of the stages A1-A5 is smaller and the number of these stages is larger. On the other hand the dynamic range of the logarithmic amplifier is substantially determined by the number of amplifier stages multiplied by the gain per stage. For example, 6 stages having a gain of 12 db each may be chosen for an AM intermediate-frequency amplifier, which yields a dynamic range of approximately 70 db. It will be evident that the number of five stages shown in FIG. 1 is only given by way of example. For a good logarithmic variation a bipolar transistor differential amplifier stage with directly coupled emitters (see FIG. 4) is preferably used in the stages.

The output signal $V_{log}$ of the logarithmic amplifier comprise: the logarithmically distorted modulation signal as well as a DC component which is dependent on the average field strength of the received input signal This field strength-dependent DC component is blocked by the DC separation in such a way that only the logarithmically distorted modulation signal appears at the input of the antilog circuit AL. This signal is converted in the antilog circuit to the original undistorted modulation signal. Consequently, where in known amplifiers the field strength dependence of the input signal is suppressed to a certain extent by an automatic gain control at one or more amplifier stages, this field strength dependence is completely suppressed in the circuit arrangement shown by the combination of logarithmic amplifier/demodulator, DC separation and antilog circuit. Whereas the logarithmic amplifier must nave a large dynamic range, for example, 20 db for the signal variations and 50 db for the field strength variations, hence a total of 70 db, the dynamic range of the antilog circuit need only be suitable for the signal variations (20 db).

The input signal of the antilog circuit should have the correct value for an optimum linearization of the signal. For example, if the logarithmically distorted signal is applied to one silicon pn junction, $V_{log}$ should increase by approximately 17-20 millivolts per octave variation of the signal $V_i$. To achieve this optimum value it may occur that either the gain per amplifier stage A1 ... A5 should be larger, which detracts from the correct logarithmic variation of the amplifier LA, or an additional amplifier stage must be introduced in the output of the adder circuit. A simpler solution may be that each amplifier stage A1 ... A4 in the cascade has two signal outputs, one having a low gain for driving the next amplifier stage and one having a higher gain for driving the associated demodulation circuit.

Figure 2:
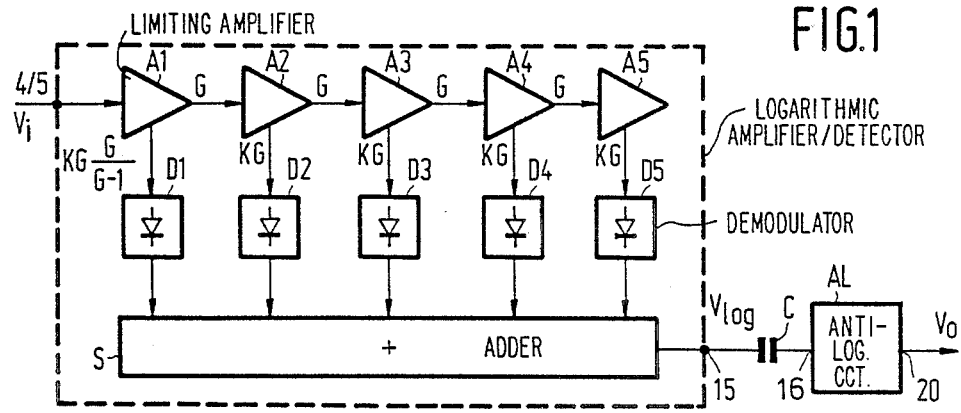
FIG. 2 is a second block diagram of a circuit according to the invention.

This is elucidated in FIG. 2 in which the same reference numerals as in FIG. 1 have been used for corresponding elements and in which the gain of the output with respect to the input of the relevant amplifier stage is indicated at the various outputs of the amplifier stages A1 ... A5. The gain G of stages A1, A2, A3 and A4 to the input of the next stage may be equal to, for example, 4 (=12 db) and the gain o: the stages A2, A3, A4 and A5 to the respective demodulation circuit is equal to K×G in which K>1. K may be equal to, for example, 2 so that $K \times G = 8 (= 18 \, db)$.

The amplifier stage which is the last to perform its limiting action in response to an increase of the input signal (i.e. the amplifier stage A1) has a gain to its demodulation output which is approximately a factor of $$\frac{G}{G-1}$$

larger than the gain to the demodulation outputs of the other amplifier stages, i.e. it holds for G=4 that $$\frac{G}{G-1} = \frac{4}{3} = 2.5 \, db$$

so that the gain of the stage A1 to its demodulation output is approximately 20.5 db.

Figure 3:
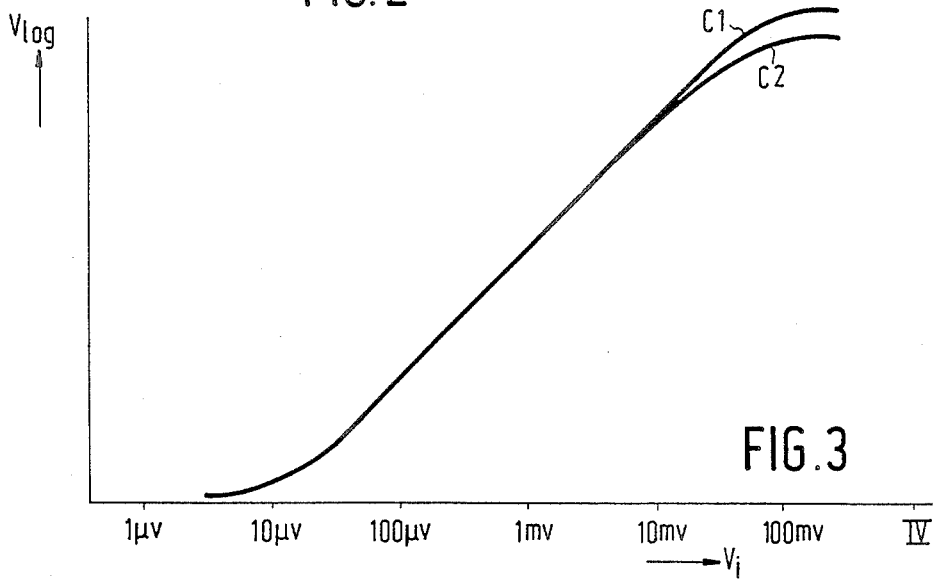
FIG. 3 shows a characteristic curve to explain the operation of the circuit of FIG. 2.

It has been found that this measure yields an improvement of the logarithmic characteristic of the logarithmic amplifier at the higher signal amplitudes. This is shown in greater detail in FIG. 3. This Figure shows the characteristic curve of the output signal $V_{Log}$ on a linear scale as a function of the amplitude of $V_i$ on a logarithmic scale. The curve C1 is the characteristic curve for six amplifier stages with G=4 and equal gains to the demodulation outputs; the curve C2 is the same characteristic curve with a 2.5 db higher gain to the demodulation output of the amplifier stage A1. Instead of the amplifier stage A1, the demodulation circuit D1 may also have the desired $$\frac{G}{G-1}$$

higher gain, for example, by choosing the value of resistor R1 to be described with reference to FIG. 4 to be smaller than the values of the corresponding resistors R2 ... Rn.

In the embodiment of FIG. 4 the cascade-arranged amplifier stages are denoted by A1 to An and the demodulation circuits are denoted by D1 to Dn. The amplifier stage A1 comprises two transistors 1 and 2 whose emitter electrodes are directly connected together. A DC source 3 is incorporated between these emitter electrodes and ground. The base electrodes of the transistors 1 and 2 are connected to two input terminals 4 and 5 of the amplifier stage A1; they also constitute the input terminals of the logarithmic amplifier. A positive power supply terminal is coupled via two series-arranged resistors 6 and 7 to the collector electrode of transistor 1 and via two series-arranged resistors 8 and 9 to the collector electrode of transistor 2. The junction points of the resistors 6 and 7 and of the resistors 8 and 9 are connected to the input terminals of the subsequent amplifier stage A2 and the collector electrodes of the transistors 1 and 2 are connected to the input terminals of the demodulation circuit D1.

The transistors 1 and 2 and their collector resistors and the common current source 3 constitute a limiting amplifier having a tanh transfer function. The gain to the next amplifier stage is determined by the value of the current source 3 and of the collector resistors 6 and 8. The larger gain to the demodulation circuit D1 is determined by the value of the current source 3 and of the series arrangements of collector resistors 6/7 and 8/9.

The demodulation circuit D1 comprises two transistors 10 and 11 with interconnected emitter electrodes and with collector electrodes connected to the positive power supply terminal. The base electrode of transistor 10 is connected to the collector electrode of transistor 1 and the base electrode of transistor 11 is connected to the collector electrode of transistor 2. The transistors 10 and 11 constitute a full-wave rectifier for the output signal of the amplifier stage A1. The interconnected emitter electrodes of these transistors are coupled to the adder circuit S via a resistor R1.

The amplifier stages A2 to An and the demodulation circuits D2 to Dn are identical to the stage A1 and to the detection circuit D1, respectively, on the understanding that the resistors 7 and 9 of the stage A1 have higher values than those of the corresponding resistors of the other stages in order to achieve the gain of the first stage which is higher by a factor of $$\frac{G}{G-1}$$

and that in the last stage An the resistors 6, 7 and 8, 9 may be combined to one collector resistor because there is no output required for a subsequent amplifier stage. As will be elucidated with reference to FIG. 6, it is advantageous to connect an FM detector FD having an output terminal 29 to the output of the last stage An.

The adder circuit S comprises a common node P to which the resistor R1 and corresponding resistors R2 ... Rn are connected, as well as a current source 12 which is connected thereto. The node P is connected to an output terminal 15 via an emitter follower circuit comprising transistor 13 and emitter resistor 11. The output terminal 15 supplies the logarithmic voltage $V_{log}$ and thus serves as the output of the logarithmic amplifier The output terminal 15 of the logarithmic amplifier is connected via a separating capacitor C to the input terminal 16 of the antilog circuit AL. It comprises a transistor 17 whose base electrode is connected to the input terminal 16 and whose emitter electrode is directly connected to ground. The collector electrode of the transistor 17 is connected to the positive power supply terminal via a collector resistor 18 and the base electrode is connected thereto via a current source 19. Finally, the collector electrode is connected to an output terminal 20 for supplying the linearized demodulated signal $V_o$. To decrease the collector impedance of the transistor 17, a common-base transistor, which constitutes a cascade with the transistor 17, can be arranged between the collector electrode of this transistor and the resistor 18.

To elucidate the operation of the separating capacitor C and the antilog circuit AL, it is assumed that the input signal at the terminals 4–5 can be represented by A.(1+m. sin μt).sin ωt in which ω is the angular frequency of the AM-modulated carrier, 1+m. sin μt is the sinusoidal AM modulation with angular frequency μ and modulation depth m, and A is the average carrier amplitude. This amplitude A changes due to field strength variations of the input signal.

Due to the demodulation and the logarithmic conversion of the logarithmic amplifier/demodulator, the signal $V_{log}$ is proportional to $ln\{A.(1+m.\sin \mu t)\} = lnA + ln(1+m.\sin \mu t)$.

The first term is the field strength-dependent DC component of $V_{log}$ which is not transferred by the capacitor C. The voltage ln(1+m. sin μt) is present across the base-emitter junction of the transistor 17 and the exponential voltage-current characteristic of this junction converts this voltage to a current I.(1+m sin μt) through collector resistor 18, in which I is the average collector current determined by the current source 19. Thus, the undistorted modulator is available at the output terminal 20.

It is to be noted that the term ln(1+m sin μt) actually comprises a modulation-dependent DC component which is of course blocked by the capacitor C and would thus lead to an incorrect linearization of the modulation signal. However, it can be shown that the current source 19, together with the exponential base-emitter junction of the transistor 17, regenerates the required DC component across this junction. The value of the direct current supplied by the source 19 also determines the amplitude of the output signal $V_o$.

If the modulation signal has a DC component of itself, as is the case with video signals, the current of the source 19 should be varied dependent on this DC component. This can be done by comparing a level of the video signal at the output terminal 20, which level should be constant, for example the peak sync level or the backporch level, with a reference level and by deriving a control voltage from the difference to control the current source 19 by means of this voltage.

As will be described with reference to FIG. 6, a control voltage $V_{level}$, which is field strength-dependent, is often required. This voltage can be derived from the voltage $V_{log}$ at the terminal 15 via a low-pass filter 21 with which the AC component of $V_{log}$ is obstructed. Such a control voltage may be obtained in a simpler manner by means of the antilog circuit of FIG. 5. In this case the voltage $V_{log}$ is directly applied to the base electrode of the transistor 17 via the terminal 16; instead of the capacitor C of FIG. 4 a capacitor C' is now arranged between the emitter electrode of transistor 17 and ground and instead of the current source 19 the antilog circuit of FIG. 5 comprises a current source 19' arranged between the emitter electrode and ground. The circuit operates substantially analogously to that of FIG. 4 but in the circuit of FIG. 5 the voltage $V_{level}$ may be directly taken off the capacitor C'. Moreover, since both the logarithmic amplifier and the antilog circuit can be fully incorporated in one IC in a simple manner, except for the capacitors C and C', which should be connected externally, only one IC pin is required for the capacitor C' in FIG. 5, whereas two IC pins are required for the capacitor C in FIG. 4.

To reduce the temperature dependence of the circuit of FIGS. 4/5, the current sources 3, 12 and 19 and 19' may be temperature-dependent, preferably in such a way that the current is proportional to the absolute temperature.

FIG. 6 shows a radio receiver for AM and FM-modulated signals. The receiver comprises an FM tuner 23 and an AM tuner 24 which can both be connected to an antenna 25. An AM/FM switch 26 supplies a power supply voltage to the FM tuner for FM reception and to the AM tuner for AM reception.

Both tuners 23 and 24 supply their FM and AM-modulated intermediate-frequency signals, respectively, to the input 4/5 of an IF circuit 27 which may have a form as described with reference to one or more of the previous Figures. The IF circuit 27 has an output 28 of the amplifier stage AN for supplying the FM intermediate-frequency signal limited and amplified by the amplifier stages A1 . . . AN. An FM demodulator 29 for demodulating the IF signal during FM reception is coupled to the output 28. The demodulated FM signal is interference suppressed in an interference pulse suppression circuit (IAC) 30 which may have a form as described in U.S. Pat. No. 3,739,285 in the name of the Applicant and the interference-suppressed signal is decoded in a stereo decoder 31 which applies via two AM/FM switches 32 and 33 the left and right stereo signals, respectively, to LF amplifiers 34 and 35 and loudspeakers 36 and 37, respectively, connected thereto.

During AM reception the AM-modulated IF signal is applied to the input 1/5 of the IF circuit 27. As described, the output 20 supplies the linearly amplified and demodulated AM signal $V_o$. This signal is freed from unwanted high-frequency components in a low-pass filter 38 and the LF signal thus filtered is applied via the AM/FM switches 32 and 33 to the LF amplifiers 34 and 35.

The $V_o$ output of the IF circuit 27 not only serves for supplying the demodulated signal during AM reception, but it is also used for M reception. In fact, this output supplies pulses during FM reception which are produced by pulse interferences in the FM signal and these pulses are applied to the suppression circuit 30 so as to block the signal supply from the FM detector to the stereo decoder for a short period. As described in U.S. Pat. No. 3,739,285, the blocking pulses may be derived alternatively from the FM-IF signal instead of from the demodulated FM signal.

The field strength-dependent DC voltage $V_{level}$ present at the output 22 of the IF circuit can also be used for FM and AM reception. To this end $V_{level}$ is applied to the stereo decoder 31 for an abrupt or gradual transition from stereo to mono reproduction when the level of the received FM signal becomes too weak for a satisfactory stereo reproduction. $V_{level}$ is also applied as an AVC voltage to the AM tuner 24 in order to reduce the RF gain of the AM tuner when receiving extremely strong AM signals.

With the exception of several circuit elements in the FM detector, all elements of the sections surrounded by a broken line in FIGS. 4 and 5 may be combined in one integrated semiconductor element in which the terminals 4, 5, 15, 16, 29 (FIG. 4) and 4, 5, 20, 22, 29 (FIG. 5) may be IC pins. This provides a very universal IC which can be used in AM receivers, FM receivers, AM/FM receivers and in receivers for signals which are both AM and FM-modulated.

It is to be noted that not all amplifier stages A1 . . . An of the logarithmic amplifier should be arranged in cascade. In this connection reference is made to the Applicant's patent application (PHN No. 12,459) of the same priority date, U.S. Ser. No. 313,652 filed Feb. 21, 1989, which is herein incorporated by reference.

I claim:

1. A circuit for linearly amplifying and demodulating an AM-modulated signal, comprising:
   a logarithmic amplifier comprising a plurality of limiting amplifier stages which successively operate in a limiting mode in response to an increase of the input signal, a demodulation circuit for each limiting amplifier stage, and an adder circuit which is common for all stages, the logarithmic amplifier having an input for receiving the AM-modulated signal and an output for supplying a demodulated, logarithmically distorted output signal;
   an antilog circuit having an input connected to the output of the logarithmic amplifier for substantially compensating the logarithmic distortion of the output signal of the logarithmic amplifier and for supplying the demodulated AM signal; and
   DC isolation means for preventing a DC component of the output signal of the logarithmic amplifier from being applied to the input of the antilog circuit.

2. A circuit as claimed in claim 1, wherein said limiting amplifier stages comprise a first output for supplying signals with a given gain to a subsequent limiting amplifier stage, and a second output for supplying signals with a higher gain to the corresponding demodulation circuit.

3. A circuit as claimed in claim 1, wherein said antilog circuit is comprised of the series combination of a capacitor and a pn junction of a semiconductor element, a current source connected to the common connection between the capacitor and the pn junction for supplying a bias current in the forward direction to the pin junction, and means for deriving the demodulated Am signal from the current through the pn junction.

4. A circuit as claimed in claim 3, wherein the pn junction is the base-emitter junction of a transistor, the capacitor and the current source are connected to the emitter electrode of the transistor, and the output for the demodulated AM signal is coupled to the collector electrode of the transistor.

5. A circuit as claimed in claim 3, wherein the output signal of the logarithmic amplifier varies approximately 17-20 mV per octave of the input signal of the logarithmic amplifier.

6. A circuit as claimed in claim 1, further comprising means for applying an FM-modulated signal to the logarithmic amplifier input, an FM detector connected to an output of one of the limiting amplifier stages of the logarithmic amplifier, and a low-frequency circuit for processing the demodulated AM signal supplied by the antilog circuit and the demodulated FM signal supplied by the FM detector.

7. A circuit as claimed in claim 6, further comprising means for deriving a field strength-dependent control signal from the output signal of the logarithmic amplifier, an AM-FM receiver circuit comprising controllable circuit stages having FM signal and AM signal field strength-dependent functions, and means for supplying the field strength-dependent control signal to a circuit stage having an FM signal field strength-dependent function and to a circuit stage having an AM signal field strength-dependent function.

8. A circuit as claimed in claim 6, comprising a suppression circuit for suppressing interference pulses in the demodulated FM signal, and means for supplying suppression pulses from the output of said logarithmic amplifier which develops the demodulated AM signal to the suppression circuit.

9. An integrated semiconductor element for use in a circuit as claimed in claim 1, comprising: integrable circuit elements including circuit elements of said logarithmic amplifier, said demodulation circuit and said adder circuit which is common for all stats, and said antilog circuit, and further comprising an input pin coupled to an input of the logarithmic amplifier for receiving the signals to be demodulated, and an output pin coupled to an output of the antilog circuit for supplying AM-demodulated signals.

10. An integrated semiconductor element as claimed in claim 9, further comprising integrable circuit elements of an FM detector and an output pin coupled to an output of the FM detector for supplying FM-demodulated signals.

11. An integrated semiconductor element as claimed in claim 9, further comprising an output pin coupled to an output of the logarithmic amplifier for supplying a field strength-dependent control signal.

* * * * *